United States Patent
Mulligan et al.

(10) Patent No.: US 9,774,240 B2
(45) Date of Patent: Sep. 26, 2017

(54) EDGE RATE CONTROL GATE DRIVER FOR SWITCHING POWER CONVERTERS

(71) Applicant: Fairchild Semiconductor Corporation, San Jose, CA (US)

(72) Inventors: Michael David Mulligan, Davis, CA (US); Timothy Alan Dhuyvetter, Arnold, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 520 days.

(21) Appl. No.: 14/511,387

(22) Filed: Oct. 10, 2014

(65) Prior Publication Data
US 2015/0028678 A1    Jan. 29, 2015

Related U.S. Application Data

(63) Continuation of application No. 13/294,558, filed on Nov. 11, 2011, now Pat. No. 8,860,398.
(Continued)

(51) Int. Cl.
*H03K 19/01* (2006.01)
*H03K 19/017* (2006.01)
(Continued)

(52) U.S. Cl.
CPC .............. *H02M 1/08* (2013.01); *H02M 3/155* (2013.01); *H03K 17/166* (2013.01);
(Continued)

(58) Field of Classification Search
CPC .. H02M 1/08; H02M 3/155; H03K 17/04123; H03K 17/161; H03K 17/163;
(Continued)

(56) References Cited

U.S. PATENT DOCUMENTS 4,791,326 A    12/1988  Vajdic et al.
5,450,019 A     9/1995  McClure et al.
(Continued)

FOREIGN PATENT DOCUMENTS

| CN | 102647080 A | 8/2012 |
| CN | 202565160 U | 11/2012 |
| EP | 0436280 A1 | 7/1991 |

OTHER PUBLICATIONS

"U.S. Appl. No. 13/294,558, Non Final Office Action mailed Oct. 1, 2013", 13 pgs.
(Continued)

*Primary Examiner* — Timothy J Dole
*Assistant Examiner* — Ivan Laboy Andino
(74) *Attorney, Agent, or Firm* — Brake Hughes Bellermann LLP

(57) ABSTRACT

This document discusses, among other things, apparatus and methods for an edge rate driver for a power converter switch. In an example, the driver can include an input node configured to receive a pulse width modulated signal, a first switch configured to couple a control node of the power converter switch to a supply voltage during a first state, a second switch configured to couple the control node of the power converter switch to a reference voltage during a second state, and a first current source configured to supply charge current to the first switch when the power converter switch transitions from the second state to the first state, the charge current configured to charge a parasitic capacitance of the power converter switch.

13 Claims, 5 Drawing Sheets

Related U.S. Application Data

(60) Provisional application No. 61/441,731, filed on Feb. 11, 2011.

(51) Int. Cl.
*H03K 19/003* (2006.01)
*H03K 17/16* (2006.01)
*H02M 1/08* (2006.01)
*H02M 3/155* (2006.01)

(52) U.S. Cl.
CPC ......... *H03K 17/161* (2013.01); *H03K 17/165* (2013.01); *H03K 19/00361* (2013.01); *H03K 19/017* (2013.01); *H03K 19/01707* (2013.01); *H03K 19/01721* (2013.01); *Y10T 307/549* (2015.04)

(58) Field of Classification Search
CPC .. H03K 17/165; H03K 17/166; H03K 19/003; H03K 19/00307; H03K 19/00315; H03K 19/00346; H03K 19/00361; H03K 19/01; H03K 19/013; H03K 19/0136; H03K 19/017; H03K 19/01707; H03K 19/01721; H03K 19/01742; H03K 5/01; H03K 5/023; H03K 5/12
USPC ........ 323/271, 282–285, 311–315, 317, 351; 327/108–112, 365, 374, 376–377
See application file for complete search history.

(56) References Cited

U.S. PATENT DOCUMENTS

| | | | | |
|---|---|---|---|---|
| 5,742,193 | A * | 4/1998 | Colli | H03K 4/00 327/108 |
| 5,828,245 | A * | 10/1998 | Brambilla | H03K 17/163 327/108 |
| 6,166,526 | A | 12/2000 | Greitschus | |
| 6,194,935 | B1 * | 2/2001 | Pioppo | H03K 17/163 327/103 |
| 6,271,699 | B1 * | 8/2001 | Dowlatabadi | H03K 17/167 327/108 |
| 6,373,296 | B1 | 4/2002 | Auer et al. | |
| 6,998,733 | B2 | 2/2006 | Kabayama et al. | |
| 7,262,650 | B2 | 8/2007 | Suzuki et al. | |
| 7,332,935 | B2 | 2/2008 | Illegems et al. | |
| 7,521,970 | B2 | 4/2009 | Gupta et al. | |
| 8,134,388 | B2 | 3/2012 | Cortigiani et al. | |
| 8,860,398 | B2 | 10/2014 | Mulligan et al. | |
| 2002/0063586 | A1 | 5/2002 | Kiehl | |
| 2005/0024090 | A1 | 2/2005 | Terletzki et al. | |
| 2005/0122146 | A1 * | 6/2005 | Lin | H03K 17/166 327/170 |
| 2007/0040542 | A1 | 2/2007 | Cortigiani et al. | |
| 2007/0210838 | A1 | 9/2007 | Gupta et al. | |
| 2010/0264957 | A1 * | 10/2010 | Tamaoka | H03K 17/145 327/109 |
| 2011/0068832 | A1 | 3/2011 | Chen et al. | |
| 2011/0115541 | A1 | 5/2011 | Barrow et al. | |
| 2011/0285378 | A1 | 11/2011 | Tamaoka | |
| 2011/0291733 | A1 * | 12/2011 | Yano | H03K 19/00361 327/306 |
| 2012/0043905 | A1 | 2/2012 | Christensen et al. | |
| 2012/0153909 | A1 * | 6/2012 | Bucossi | H02M 1/15 323/271 |
| 2012/0206123 | A1 | 8/2012 | Mulligan et al. | |

OTHER PUBLICATIONS

"U.S. Appl. No. 13/294,558, Notice of Allowance mailed Jun. 16, 2014", 13 pgs.
"U.S. Appl. No. 13/294,558, Response filed Feb. 28, 2014 to Non Final Office Action mailed Oct. 1, 2013", 10 pgs.
"Chinese Application Serial No. 201210031479.6, Office Action mailed Nov. 1, 2013", 9 pgs.
"Chinese Application Serial No. 201210031479.6, Office Action mailed Aug. 14, 2014", 8 pgs.
"Chinese Application Serial No. 201210031479.6, Response filed May 15, 2014 to Office Action mailed Nov. 1, 2013", w/English Claims, 10 pgs.
"Chinese Application Serial No. 201210031479.6, Office Action mailed Feb. 28, 2015", 5 pgs.
"Chinese Application Serial No. 201210031479.6, Response filed Oct. 29, 2014 to Office Action mailed Aug. 14, 2014", 14 pgs.
"Chinese Application Serial No. 201210031479.6, Response filed March 25, 2015 to Office Action mailed Feb. 28, 2015", 20 pgs.

* cited by examiner

EDGE RATE CONTROL GATE DRIVER FOR SWITCHING POWER CONVERTERS

CLAIM OF PRIORITY

This patent application is a continuation of U.S. patent application Ser. No. 13/294,558, filed on Nov. 11, 2011, and issued as U.S. Pat. No. 8,860,398 on Oct. 14, 2014, which claims the benefit of priority to U.S. Provisional Patent Application Ser. No. 61/441,731, filed on Feb. 11, 2011, the benefit of priority of each of which is claimed hereby, and each of which are incorporated by reference herein in its entirety.

BACKGROUND

Switching power converters can generate unwanted electromagnetic interference (EMI) due to fast transitions at their switching nodes. The switching transitions can be slowed, for example, using a resistor current ballast. However, such solutions can result in non-linear switching edges that are not predictable or controllable.

OVERVIEW

This document relates generally to apparatus and methods for an edge rate driver for a power converter switch. In an example, the driver can include an input node configured to receive a pulse width modulated signal, a first switch configured to couple a control node of the power converter switch to a supply voltage during a first state, a second switch configured to couple the control node of the power converter switch to a reference voltage during a second state, and a first current source configured to supply charge current to the first switch when the power converter switch transitions from the second state to the first state, the charge current configured to charge a parasitic capacitance of the power converter switch.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized a system to reduce EMI by slowing the switching node transitions of a converter power switch in a controlled, yet efficient manner. In an example, a constant current gate driver can control the charging of gate-to-drain capacitance of the power switch. Such gate to drain capacitance can be a parasitic capacitance or an explicit capacitor of the converter power switch. Such capacitance can be a dominant parameter when controlling a power MOSFET, such as one employed in a switching power converter. In an example, rise and fall times of a power MOSFET switching node can become a function of the charging current. In certain examples, increased efficiency can be realized using switched current sources that consume little if any power outside of the intervals for transitions of a switched node state, for example between a first high logic level state and a second low logic level state.

In certain examples, a power converter can include a current source gate driver that can control the charging of capacitance of a power converter switch, such as parasitic capacitance of the power converter switch. Such parasitic capacitance can determine rise and fall times of switching nodes of the power converter. In an example, the current source gate driver can slow switch node transitions in a controlled and efficient manner. For example, the gate drive according to the present subject matter can reduce static bias current compared to similarly sized existing switching converters. In certain examples, feedback can be applied to improve speed and reliability of the power converter.

Figure 1:
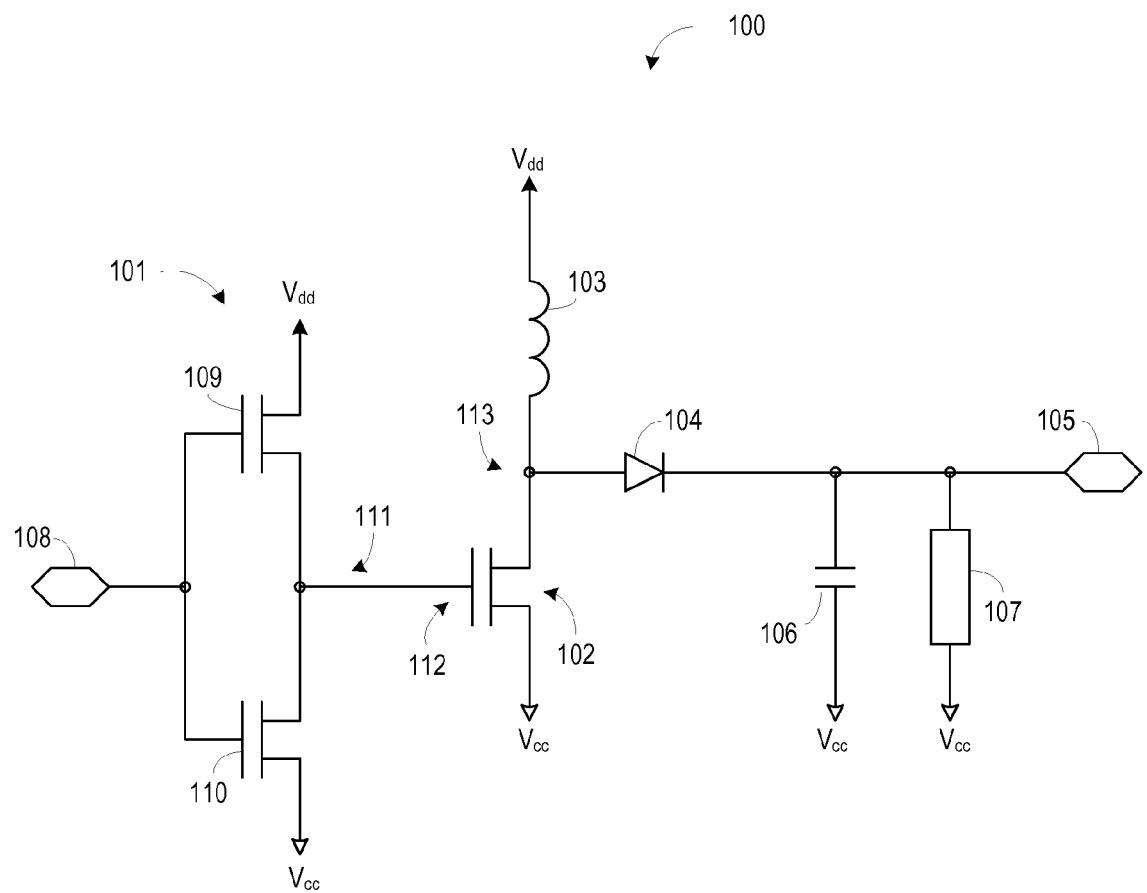
FIG. 1 illustrates generally an example of a gate driver applied to a boost switching converter.

FIG. 1 illustrates generally an example of a gate driver for a boost converter 100. The boost converter 100 includes the gate driver 101, a power switch 102, an inductor 103, a second power switch, such as a diode 104, and a converter output 105. In certain examples, the boost converter 100 can include one or more of a load capacitor 106 and a load resistor 107 coupled to the converter output 105. The gate driver 101 can include an input 108 coupled to first and second driver switches 109, 110. In an example, the first driver switch 109 can be coupled to a first logic level supply $V_{dd}$ and the second driver switch 110 can be coupled to a second logic level supply $V_{cc}$. The first and second driver switches 109, 110 can be coupled to each other and a driver output 111. The driver output 111 can be coupled to a control node 112 of the power switch 102, such as a gate node of a power transistor. In an example, switching action of the control node 112 can be that of a high-low-high inverter transition. Gate-to-drain capacitance of device the power switch 102 can represent a dominant element that can determine a switching speed of a switched node 113 of the boost converter 100. During a transition of an input signal, such as a received pulse width modulated (PWM) signal, the control node 112 can be pulled high or low through a very low impedance path, for example including either the first driver switch 109 or the second driver switch 110. Characteristics of a transition at the switched node 113 can be a function of the load coupled to the converter output 105 for low to high logic level transitions of a switched node $V_{gs}$ of the power switch 102, and of the first logic level supply $V_{dd}$ and device size of the first driver switch 109 for high to low logic level transitions of switch node 113.

Figure 2:
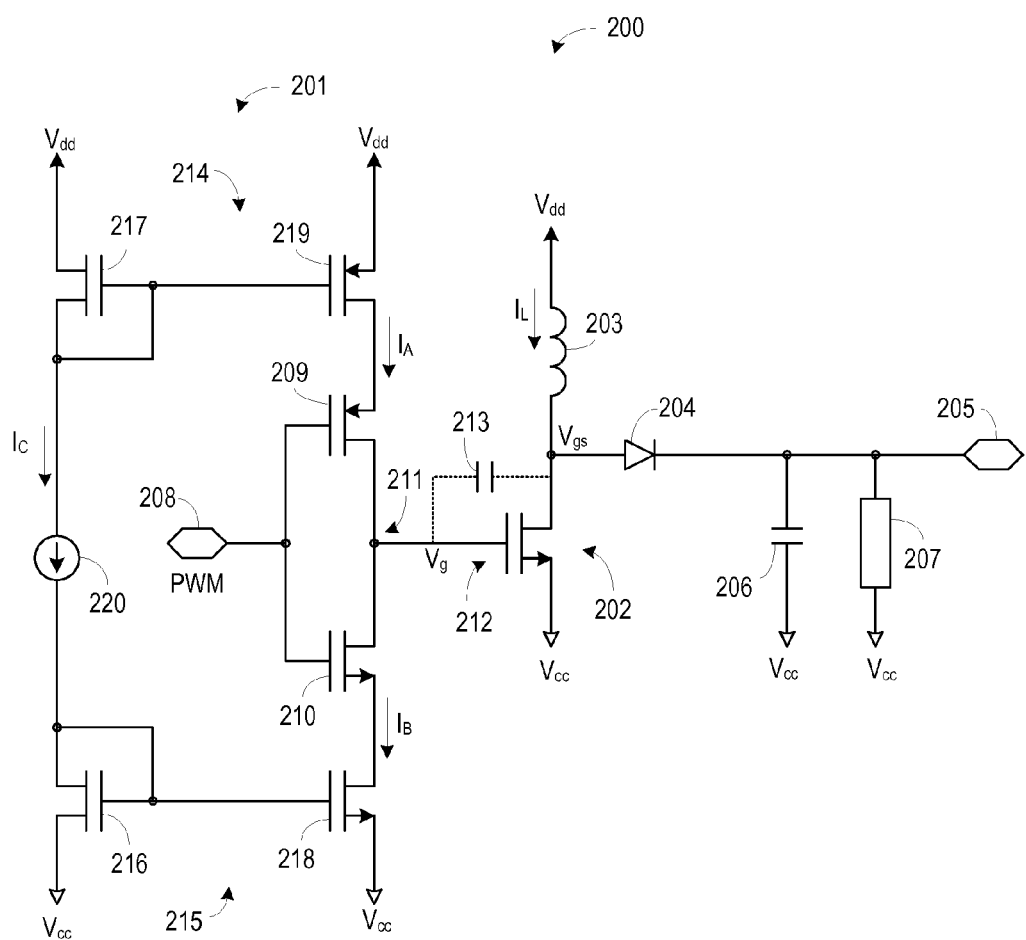
FIG. 2 illustrates generally an example of a boost converter including an edge rate control (ERC) gate driver.

FIG. 2 illustrates generally an example of a boost converter 200 including an edge rate control (ERC) gate driver 201. The boost converter 200 can include the ERC gate driver 201, a power switch 202, an inductor 203, a second power switch, such as a diode 204, and a converter output 205. In certain examples, the boost converter 200 can include one or more of a load capacitor 206 and a load resistor 207 coupled to the converter output 205. The ERC gate driver 201 can include an input 208 coupled to first and second driver switches 209, 210.

In an example, the first driver switch 209 can be coupled to a first logic level supply $V_{dd}$ and the second driver switch 210 can be coupled to a second logic level supply $V_{cc}$. The first and second driver switches 209, 210 can be coupled to each other and a driver output 211. The driver output 211 can be coupled to a control node 212 of the power switch 202, such as a gate node of a power transistor. The power switch 202 can include a capacitance 213. The capacitance 213 can be associated with the structure of the power switch 202 or can include one or more capacitors associated with the power switch circuit.

The ERC gate driver 201 can include a first switched current source 214, and a second switched current source 215. In an example, each of the first switched current source 214 and the second switched current source 215 can include a current mirror. Each current mirror can include a current sense transistor 216, 217 and a current mirror transistor 218, 219. Each current mirror can detect a sensed current $I_C$ flowing through the sense transistor 216, 217 to provide a controlled mirrored current $I_A$, $I_B$ to charge and discharge the power switch capacitance 213.

In an example, the sensed current $I_C$ for the first and second current mirrors can be set independently. In an example, a third current source 220 that can control the sensed current $I_C$. In an example, each current mirror can provide a scaled representation of the sensed current $I_C$ as the mirror current $I_A$, $I_B$, such that the sense current $I_C$ is substantially smaller than the mirror current $I_A$, $I_B$.

In an example, the third current source 220 can include a controller. The controller can receive the input signal and can independently switch the first and second switched current sources 214, 215. In certain examples, the third current source 220 can be adjustable to allow individual or dynamic adjustment of an edge rate of a signal at the output 205. In certain examples, a controlled current can provide a smoother transition between the first state of the power switch 202 and the second state of the power switch 202. In certain examples, controlled ramping between power switch states can provide fast switching with reduced and bandwidth limited EMI.

Figure 3:
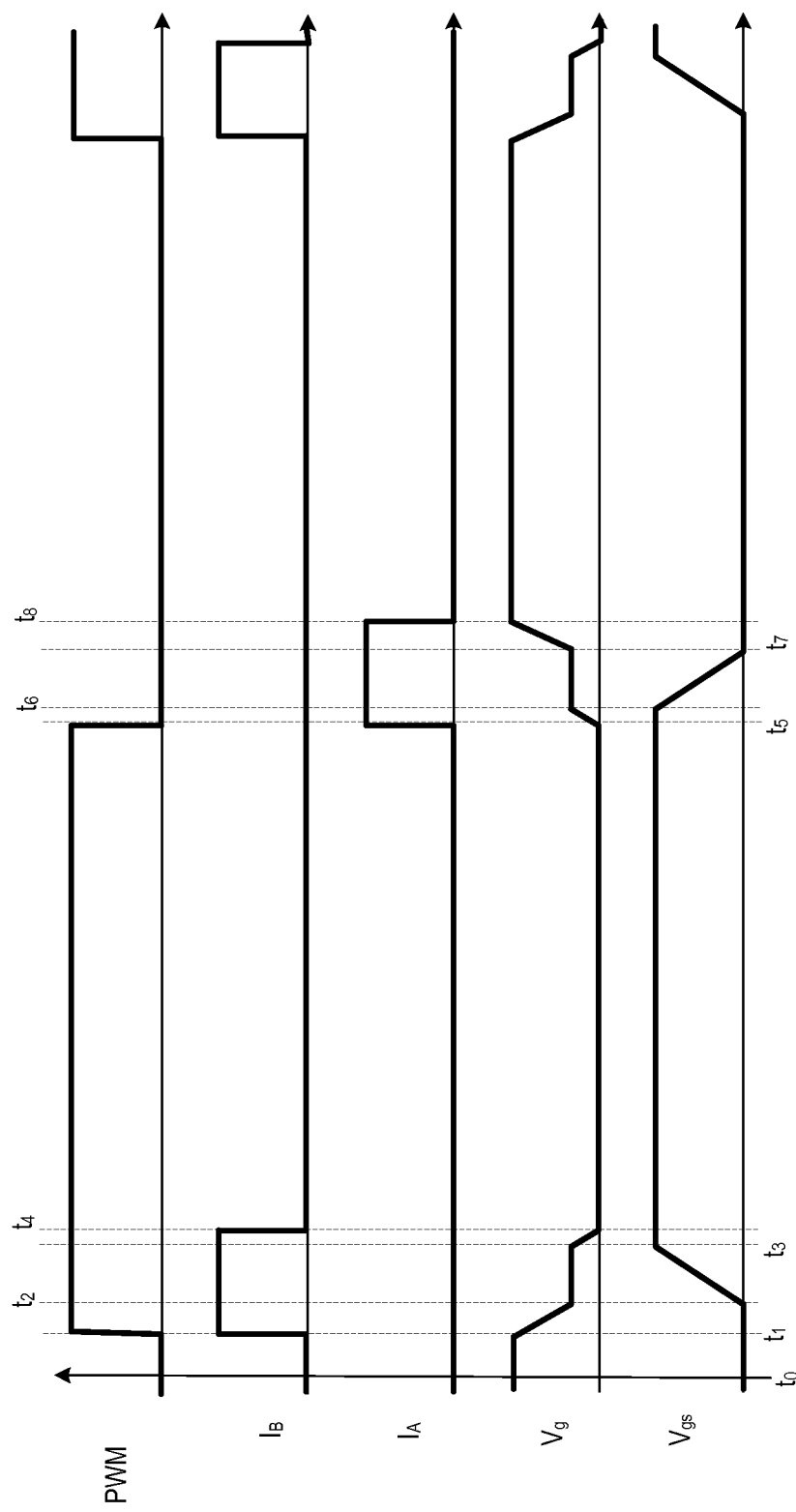
FIG. 3 illustrates generally waveforms associated with an example method of operating the boost converter of FIG. 2.

FIG. 3 illustrates generally waveforms associated with an example method of operating the boost converter of FIG. 2. In an example, at time $t_0$, a low logic signal, such as a pulse width modulated (PWM) signal, can be present at the input 208, and a corresponding high logic level can be at the control node ($V_g$) 212, or gate, of the power switch 202. In a steady state, the power switch 202 can couple the inductor to the second supply voltage Vcc such that a node common to the power switch 202 and the inductor 203, the switched node, Vgs, is at about the second supply voltage Vcc. At $t_1$, a high PWM signal can be received at the input 208 to the ERC gate driver 201. The high PWM signal can cause current $I_B$ to begin discharging the capacitance 213 of the power switch 202, thus, pulling the voltage at the control node $V_g$ 212 toward the second supply voltage $V_{cc}$. At $t_2$, the control node $V_g$ 212 can reach a point at which current through the power switch 202 is substantially equal to the current $I_L$ through the inductor 203, e.g., $I_L$-$I_B$. The voltage at the gate node $V_g$ 212 can hold nearly constant and the voltage at the switched node $V_{gs}$ can begin rising in a substantially linearly fashion. At $t_3$, the voltage at the switched node $V_{gs}$ reaches approximately a diode drop above the output voltage and the diode 204 begins conducting. The voltage at the control node $V_g$ 212 can continue to discharge the capacitance until reaching about $V_{cc}$, at $t_4$.

In an example, a falling transition of the PWM signal at $t_5$ can cause current $I_A$ to begin charging the capacitance 213 of the power switch 202, thus, pulling the control node $V_g$ 212 toward the first supply voltage $V_{dd}$ until it sinks current substantially equal to $I_A$+$I_L$ at $t_6$. With the current balanced, the voltage at the control node $V_g$ 212 can remain nearly constant and the voltage at the switched note $V_{gs}$ of the power switch 202 can begin falling in a substantially linearly fashion. At $t_7$, the voltage at the switched note $V_{gs}$ of the power switch 202 can reach approximately the second supply voltage $V_{cc}$, and the control node $V_g$ 212 can continue to charge until reaching the first supply voltage $V_{dd}$ at $t_8$. In an example, the second supply voltage $V_{cc}$ can be ground.

Figure 4:
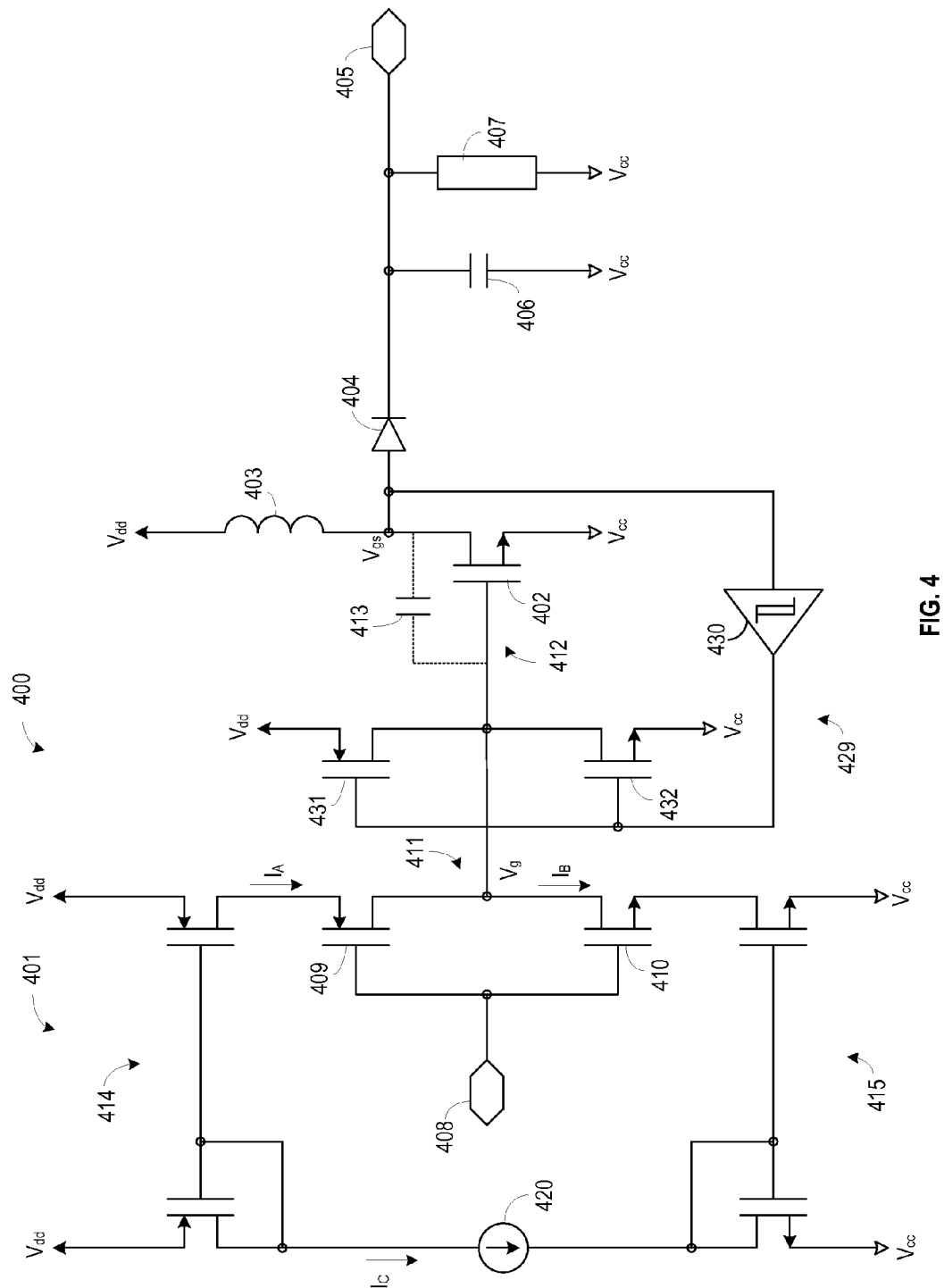
FIG. 4 illustrates generally an alternative example of a boost controller with a ERC gate driver.

FIG. 4 illustrates generally an alternative example of a boost converter 400 including an ERC gate driver 401, a power switch 402, an inductor 403, a second power switch, such as a diode 404, and a converter output 405. In certain examples, the boost converter 400 can include one or more of a load capacitor 406 and a load resistor 407 coupled to the converter output 405. The ERC gate driver 401 can include an input 408 coupled to first and second driver switches 409, 410. As discussed above with reference to FIG. 2, the ERC gate driver 401 can include a first current mirror 414, a second current mirror 415, and a current source 420 to assist in controlling transition edge rates of the output 405. In addition, the boost converter 400 can include a schmitt trigger circuit 429, including a schmitt trigger 430 and first and second switches 431, 432. The schmitt trigger circuit 429 can provide hard switching of the control node 412 of the power switch 402. In an example, the schmitt trigger circuit 429 can detect that the voltage at the control node 412 of the power switch 402 is near a high or low state, $V_{dd}$ or $V_{cc}$. The Schmitt trigger circuit 429 can turn on the first or second switch 431, 432, respectively, to provide the control node 412 of the power switch 402 with a low impedance path to the first supply $V_{dd}$ or the second supply $V_{cc}$. The low impedance paths provided by the first and second switches 431, 432 can prevent glitches on the control node 412 from affecting a steady state of the power switch 402.

Figure 5:
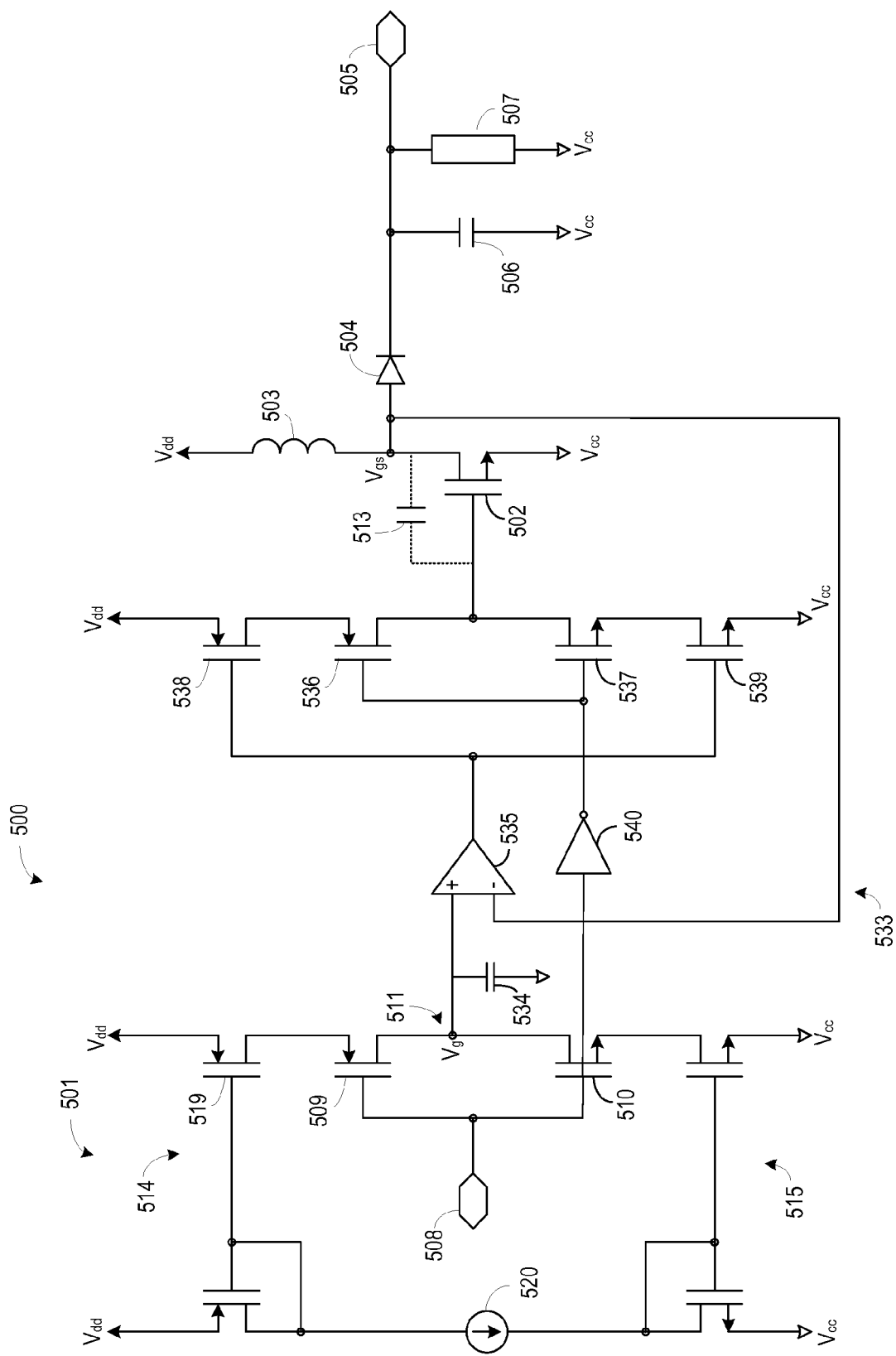
FIG. 5 illustrates generally and alternative example of a boost converter including a ERC gate driver.

FIG. 5 illustrates generally an alternative example of a boost converter 500 including an ERC gate driver 501, a power switch 502, an inductor 503, a second power switch, such as a diode 504, and a converter output 505. In certain examples, the boost converter 500 can include one or more of a load capacitor 506 and a load resistor 507 coupled to the converter output 505. The ERC gate driver 501 can include an input 508 coupled to first and second driver switches 509, 510. As discussed above with reference to FIG. 2, the ERC gate driver 501 can include a first current mirror 514, a second current mirror 515, and a current source 520 to assist in controlling transition edge rates of the output 505. In certain examples, the boost converter 500 can include a feedback circuit 533 to control the edge rate of the boost converter output 505.

In certain examples, the feedback circuit 533 can include a reference capacitor 534, an error amplifier 535, secondary driver switches 536, 537, secondary current sources 538, 539, and an inverter 540. The feedback circuit 533 can receive a command signal indicative of a desired transition ramp of the boost converter output 505. In certain examples, the command signal can be generated across the reference capacitor 534 coupled to a junction $V_g$ between the first and second driver switches 509, 510. The error amplifier 535 can control the secondary current sources 538, 539 using an error signal derived from the command signal and a feedback signal indicative of the switch output $V_{gs}$ of the power switch 502. In certain examples, the feedback circuit 533 can introduce an inversion, and thus, the inverter 540 can provide the proper control signal for the secondary driver switches 536, 537. In certain examples, the feedback circuit 533 can allow faster transitions of the switched output $V_{gs}$ of the power switch 502. In certain examples, the transition rate can be adjusted by selecting a different reference capacitor size. In certain examples, the closed loop nature of the feedback circuit 533 can provide a more linear transition of the switched output $V_{gs}$ of the power switch 502 over open loop edge rate control. The more controlled edge rates can provide more predictable and bandwidth limited EMI, even for faster transitions and, in turn, can provide opportunities for more efficient and precise handling of the EMI. In addition, the more controlled transitions can provide a more efficient boost converter 500.

Additional Notes

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, although the examples above have been described relating to PNP devices, one or more examples can be applicable to NPN devices. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An edge rate driver for a power converter switch, the edge rate driver comprising:
    an input node configured to receive a pulse width modulated signal;
    a first switch configured to couple a control node of the power converter switch to a supply voltage during a first state;
    a second switch configured to couple the control node of the power converter switch to a reference voltage during a second state;
    a first current source configured to supply charge current to the first switch when the power converter switch transitions from the second state to the first state, the charge current configured to charge a parasitic capacitance of the power converter switch;
    a second current source configured to provide discharge current for the second switch when the power converter switch transitions from the first state to the second state, the discharge current configured to discharge the parasitic capacitance of the power converter switch; and
    a feedback circuit configured to receive a voltage from an output node of the power converter switch and to modulate a transition of the control node of the power converter switch, the feedback circuit configured to hard switch the control node of the power converter switch;
    wherein the feedback circuit includes:
        secondary driver switches configured to couple to the control node of the power converter switch;
        an inverter configured to control the secondary driver switches;
        secondary current sources configured to couple to the secondary driver switches;
        an error amplifier configured to receive the voltage from the output node of the power converter switch and to control the secondary current sources; and
        a reference capacitor coupled to a node between the first switch and the second switch and configured to provide a command signal to the error amplifier.

2. The edge rate driver of claim 1, including a third current source coupled to the first current source and the second current source, the third current source configured to control a ramp rate of a voltage at an output of the power converter switch.

3. The edge rate driver of claim 2, wherein the first current source includes a first current mirror configured to provide a first mirrored current representative of a sensed current;
    wherein the third current source is configured to provide the sensed current;
    wherein the second current source includes a second current mirror configured to provide a second mirrored current representative of the sensed current; and
    wherein the third current source includes an adjustable current source configured to adjust a transition rate of the power converter switch.

4. A method comprising:
    receiving a pulse width modulated signal at an input of an edge rate driver for a power converter switch;
    coupling a control node of the power converter switch to a supply voltage during a first state using a first switch of the edge rate driver;

coupling a control node of the power converter switch to a reference voltage during a second state using a second switch of the edge rate driver;

charging a reference capacitor using a first current source when the power converter switch transitions from the second state to the first state;

discharging the reference capacitor using a second current source when the power converter switch transitions from the first state to the second state;

receiving a voltage from an output node of the power converter switch at a feedback circuit;

modulating a transition of the control node of the power converter switch using the feedback circuit;

coupling the control node of the power converter switch to the supply voltage during the first state using a first secondary drive switch and a first secondary current source;

coupling the control node of the power converter switch to the reference voltage during the second state using a second secondary drive switch and a second secondary current source;

inverting the pulse width modulated signal to drive the first and second secondary drive switches;

receiving the voltage from the output node of the power converter switch at an error amplifier;

receiving a voltage of the reference capacitor at the error amplifier; and controlling a control node of the first secondary current source and a control node of the second secondary current source using an output of the error amplifier.

5. The method of claim 4, wherein the charging the reference capacitor includes providing a charge current to the first switch using a first current mirror.

6. The method of claim 5, wherein the discharging the reference capacitor includes providing a discharge current from the second switch using a second current mirror.

7. The method of claim 6, including setting a first transition rate of the power converter switch using a first sense current of the first current mirror.

8. The method of claim 7, including setting a second transition rate of the power converter switch using a second sense current of the second current mirror.

9. The method of claim 8, including providing the first sense current using a third current source.

10. The method of claim 9, including providing the second sense current using the third current source.

11. The method of claim 10, including adjusting the third current source to change at least one of the first transition rate or the second transition rate of the power converter switch.

12. The method of claim 4, including setting a first transition rate of the power converter switch using a first value for the reference capacitor.

13. The method of claim 12, including setting a second transition rate of the power converter switch using a second value for the reference capacitor.

* * * * *